Figure 1:
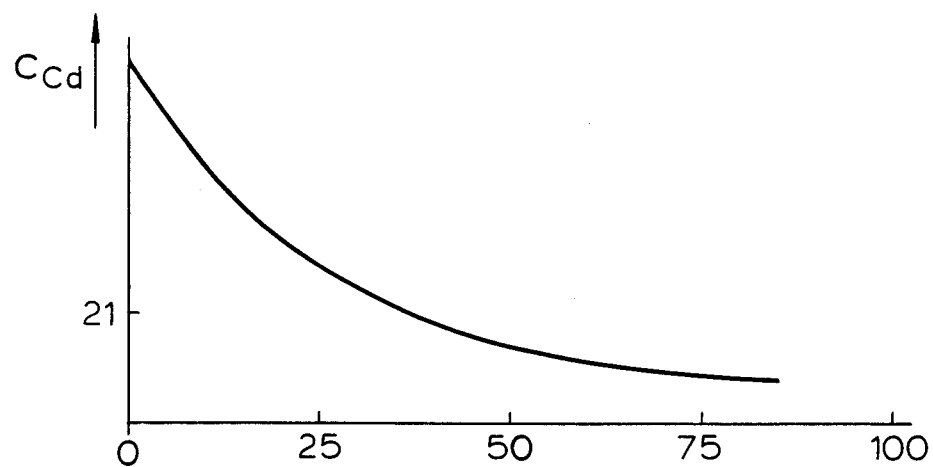

United States Patent [19]

Bartlett et al.

[11] Patent Number: 4,578,145
[45] Date of Patent: Mar. 25, 1986

[54] METHOD OF MAKING MONOCRYSTALLINE TERNARY SEMICONDUCTOR COMPOUNDS

[75] Inventors: Brian E. Bartlett, Hampshire; James E. Harris, Southampton; John G. Wilkes, Ashurst, all of England

[73] Assignee: U.S. Philips Corporation, New York, N.Y.

[21] Appl. No.: 416,210

[22] Filed: Sep. 9, 1982

Related U.S. Application Data

[63] Continuation of Ser. No. 164,420, Jun. 30, 1980, abandoned.

[30] Foreign Application Priority Data

Jul. 5, 1979 [GB] United Kingdom ............... 7923412

[51] Int. Cl.$^4$ ............................................. C30B 11/02
[52] U.S. Cl. .................... 156/616 R; 156/DIG. 70
[58] Field of Search ...... 156/616 R, 616 A, DIG. 72, 156/DIG. 82, DIG. 70

[56] References Cited

U.S. PATENT DOCUMENTS

| | | | |
|---|---|---|---|
| 3,468,363 | 9/1969 | Parker et al. | 75/169 |
| 3,514,265 | 5/1970 | Pastore | 156/616 R |
| 3,622,399 | 11/1971 | Johnson | 156/DIG. 72 |
| 3,656,944 | 4/1972 | Brav | 75/135 |
| 3,849,205 | 11/1974 | Brav et al. | 156/620 |
| 4,011,074 | 3/1977 | Dietl et al. | 75/169 |

FOREIGN PATENT DOCUMENTS 35279 1/1974 Japan ............................ 156/616 R

OTHER PUBLICATIONS

Dziuba, J. Electrochem Soc.: Solid State Science, V 116, Jan. 69, pp. 104–106.
Ueda et al., Jl. Crystal Growth, V 13, 3/72, pp. 668–671.
Pfann, Zone Melting, Wiley 7/58, pp. 60–63.
Woolley, Compound Semiconductors V I, 1962, pp. 3–6.

Primary Examiner—Hiram H. Bernstein
Attorney, Agent, or Firm—Norman N. Spain

[57] ABSTRACT

A significant problem in making monocrystalline ternary semiconductor compound material, for example cadmium mercury telluride, is to produce useful quantities of the material which have electrical properties within a narrow band of values, and this depends on the material having a composition within a narrow range. Monocrystalline cadmium mercury telluride may be made by preparing a melt of the material, quenching this melt so as to produce a polycrystalline ingot 16, sealing the ingot 16 in an ampoule 13, and then forming a molten zone 20 at one end of the ingot 16 and passing this molten zone through the ingot 16 so as to form monocrystalline cadmium mercury telluride 21. The length of the molten zone 20 is from 25 to 40% of the length of the ingot 16.

7 Claims, 8 Drawing Figures

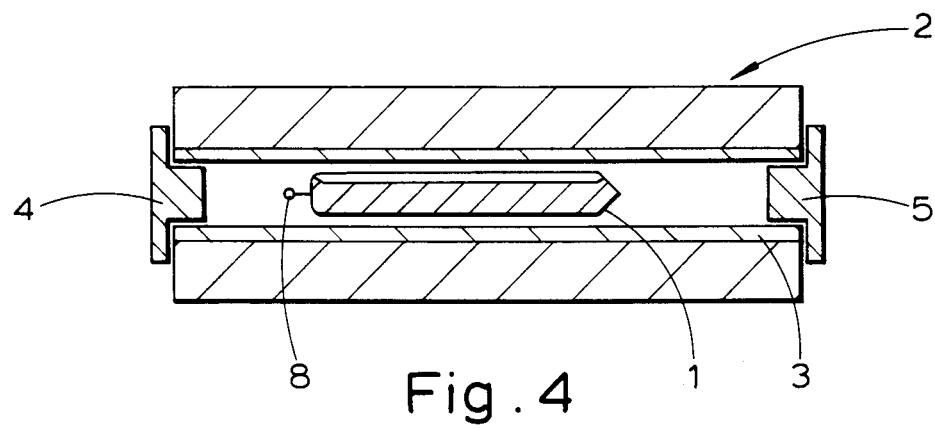
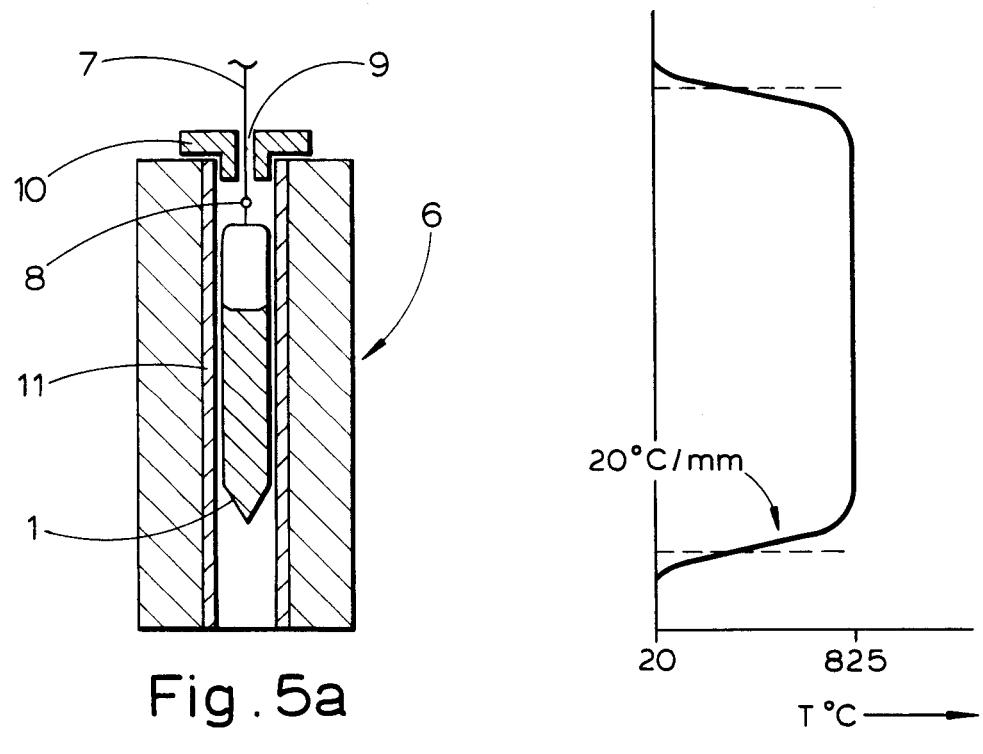

METHOD OF MAKING MONOCRYSTALLINE TERNARY SEMICONDUCTOR COMPOUNDS

This is a continuation of application Ser. No. 164,420, filed June 30, 1980 and now abandoned.

The invention relates to a method of making monocrystalline ternary semiconductor compounds, and to monocrystalline semiconductor ternary compounds made by such a method.

Such ternary semiconductor compounds consists of elements A, B and C, and have compositions defined by the formula $A_x$, $B_{1-x}C_y$ wereh $1>x>0$ and $1.05>y>0.95$. These compounds can be considered to be pseudobinary solid solutions of the two compounds $AC_y$ and $BC_y$. Ternary semiconductor compounds comprise II-VI compounds, for example cadmium mercury telluride, III-V compounds, for example indium arsenide antimonide, and IV-VI compounds, for example, lead tin telluride.

When manufacturing semiconductor devices from a ternary semiconductor compound, a significant problem is to obtain adequate quantities of the monocrystalline ternary compound within a given range of compositions so as to have desired electro-optic properties, for example, in the case of cadmium mercury telluride used in the detection of infra-red radiation.

U.S. Pat. No. 3,849,205 describes a method of producing monocrystalline ternary semiconductor compound material, which method comprises the steps of preparing a melt of the ternary semiconductor compound, quenching the melt to form a polycrystalline ingot of uniform composition, melting a portion of the ingot, allowing single crystal growth to occur at the liquid-solid interface whereby a single crystal nucleus is formed at the liquid-solid interface, and propagating single crystal growth through the rest of the ingot by solid state recrystallisation.

Although a method in which a monocrystalline ternary semiconductor compound is produced by recrystallisation of a polycrystalline ingot, which ingot has been produced by quenching a melt of the compounds is capable of producing a single crystal of homogeneous composition along the length of the crystal, the impurity content of the single crystal will be homogeneous and identical with that of the melt, since there will have been no segregation of impurities during the quenching process.

An object of the invention is to provide an improved method of making monocrystalline ternary semiconductor compound material of homogeneous composition.

The invention provides a method of making monocrystalline ternary semiconductor compound material, the method comprising the steps of preparing a melt of the ternary semiconductor compound, quenching the melt so as to produce a polycrystalline ingot, and then passing a molten zone having a length which is from 25 to 40% of the length of the ingot through the ingot at a rate of from 0.1 to 2 mm per hour so as to produce a single crystal.

The ternary semiconductor compound may be considered to comprise two compounds, each compound consisting of one element of Group IIB and one element of Group VIB of the Mendeleev Periodic Classification. Such a ternary semiconductor compound may be, for example, cadmium mercury telluride. The ternary semiconductor compound may comprise two compounds, each compound consisting of one element of Group IIIB and one element of Group VB of the Mendeleev Periodic Classification. Such a ternary semiconductor compound may be, for example, indium antimonide arsenide. The ternary semiconductor compound may comprise two compounds, each compound consisting of one element of Group IVB and one element of Group VIB of the Mendeleev Periodic Classification. Such a ternary semiconductor compound may be, for example, lead tin telluride.

Figure 2:
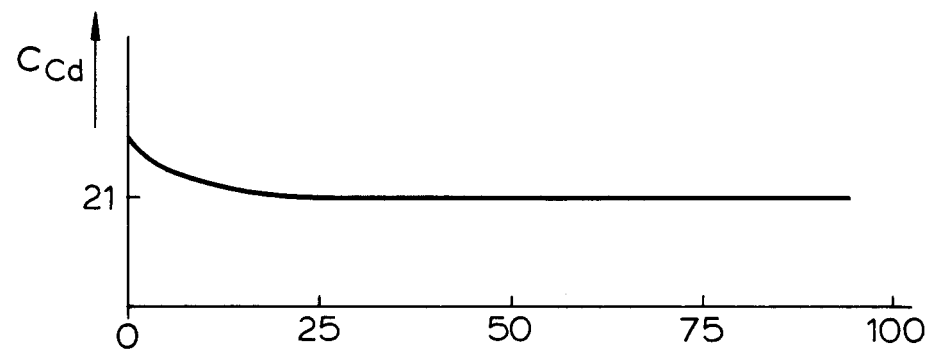
Figure 3:
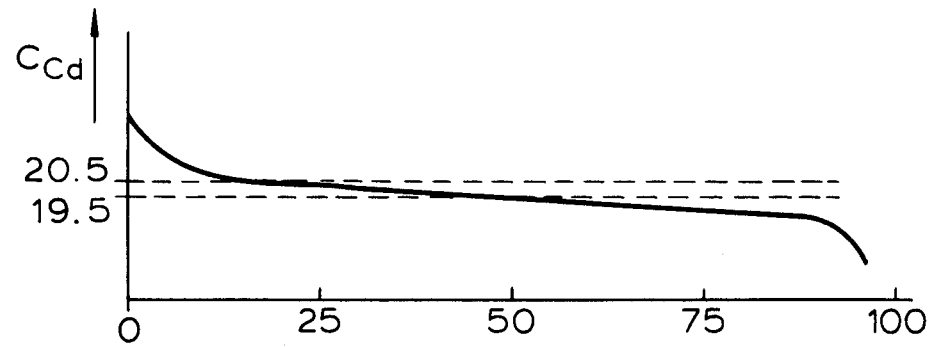
Figure 6A:
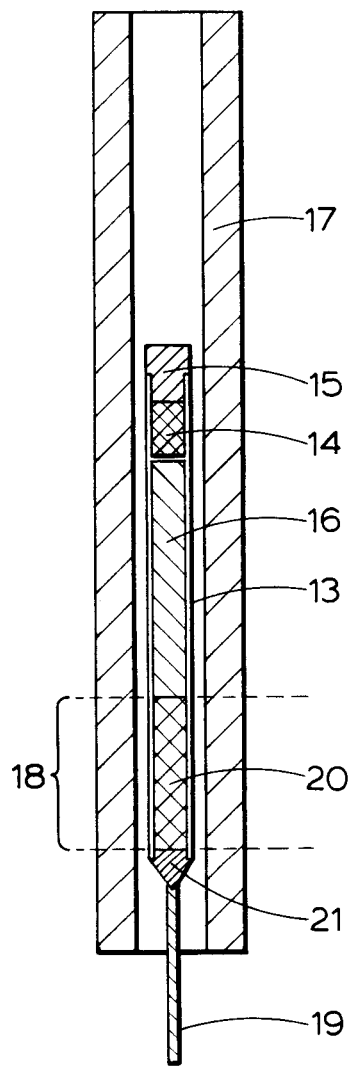
Figure 6B:
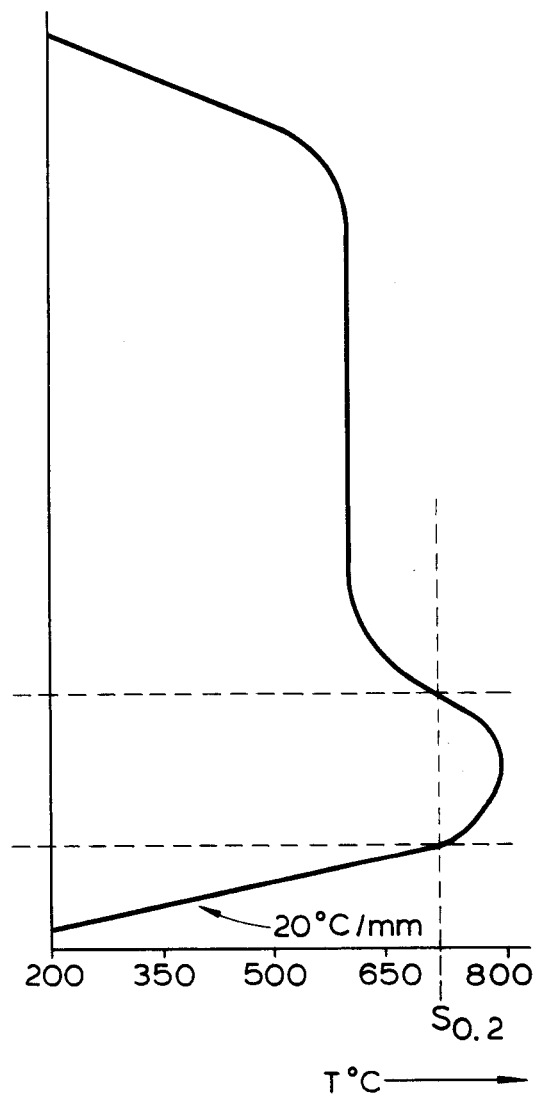

In the accompanying drawings,

FIG. 1 shows the longitudinal composition profile of a cadmium mercury telluride single crystal formed by a melt growth method, FIG. 2 shows the longitudinal composition profile of a polycrystalline ingot of cadmium mercury telluride produced by rapidly quenching a melt, FIG. 3 is a longitudinal composition profile of a single crystal of cadmium mercury telluride grown by a method according to the invention, and FIG. 4 is a schematic longitudinal section of a rocking furnace, FIG. 5a is a side-sectional elevation of a furnace used to heat a melt of cadmium mercury telluride immediately prior to a quenching process, FIG. 5b is a temperature profile of the furnace shown in FIG. 5a, FIG. 6a is a side-sectional elevation of a furnace used to grow a single crystal from a polycrystalline ingot, and FIG. 6b is a temperature profile of the furnace shown in FIG. 6a.

A single crystal grown by a melt growth process at a rate of 0.5 mm per hour has a composition profile along its length as shown in FIG. 1. Due to the segregation of cadmium telluride with respect to mercury telluride, there is a gradual variation in the composition along the length of the single crystal. When cadmium mercury telluride within a narrow range of compositions is required, the yield of such material from a single crystal grown by this method will be impracticably low.

If a cadmium mercury telluride ingot is made by quenching a melt having a composition $Cd_{0.21}Hg_{0.79}Te$ so that the material is solidified in less than 20 seconds, the composition profile along the length of the ingot is as shown in FIG. 2, i.e. approximately 80% of the length of the ingot has a constant longitudinal composition.

The composition of monocrystalline ternary semiconductor compound material having desired properties, for example electro-optic properties lies within a narrow range. For example, in the case of cadmium mercury telluride which has desired electro-optic properties for infra-red radiation having wavelengths between 8 and 14 μm, the material must have a $CdTe_y$ content in the range from 19.5 to 20.5 mol.%. During the investigations which led to the present invention, it was found that even when the utmost care is taken in controlling the quantities of the constituent elements of the ternary semiconductor compound which are loaded into an ampoule which is subsequently sealed, the contents of the sealed ampoule being subsequently reacted together and processed into the melt of the ternary semiconductor compound which is quenched, due to such variables as the remaining free space in the sealed ampoule, the wall thickness and hence the thermal conductivity of the ampoule, it is not possible to produce ingots having identical compositions.

FIG. 3 is a longitudinal composition profile of a single crystal of cadmium mercury telluride made by a method according to the invention. It will be seen that this composition profile is intermediate between the composition profiles of FIGS. 1 and 2. Whereas it will be seen from FIG. 2, that about 80% of an ingot will have a constant longitudinal composition, it will be seen from FIG. 3 that up to 40% of the single crystal will have compositions within the range from 19.5 to 20.5 mol.% $CdTe_y$.

The longitudinal composition profile is only one factor affecting the yield of monocrystalline material having desired properties. Other factors include variations in radial composition, carrier concentration and crystal quality. Quenched ingots have unacceptable crystal quality, high carrier concentration and a distinct core composition. A recrystallization process can improve the crystal quality, and annealing may improve the carrier concentration. There is no solid state process which can alter the core composition. A melt growth process produces material with acceptable crystal quality and radial composition variations.

An embodiment of the invention will now be described with reference to the following Example and to FIGS. 4, 5a, 5b 6a and 6b of the drawings. In the Example, the method is used to grow a single crystal of cadmium mercury telluride containing a significant proportion of material suitable for use in photoconductive infra-red detector elements which can operate at wavelengths from 8 to 14 μm. The cadmium mercury telluride $Cd_xHg_{1-x}Te_y$ compositions which meet this condition have compositions defined by this formula when x is between 0.195 and 0.205, and y is between 1.00 and 0.995.

EXAMPLE 80.9967 g of mercury, 11.0293 g of cadmium and 62.6041 g of tellurium were placed in a 300 mm long silica ampoule 1 having an internal diameter of 13±0.5 mm and a wall thickness of 3±0.5 mm, the charge in the ampoule 1 corresponding to a composition $Cd_{0.2}Hg_{0.8}Te$, including an excess of 2.3 g mercury. The ampoule 1 was evacuated and sealed, and the sealed ampoule was placed in a conventional resistance-heated rocking furnace 2 (shown schematically in FIG. 4). The rocking furnace 2 had an alumina furnace tube 3 which was closed at each end by alumina plugs 4, 5 which serve to reduce the heat loss from the ends of the furnace. The ampoule 1 was heated to 500° C. in 1 hour, and the temperature of the ampoule 1 was then raised to 825° C. over a period of 24 hours and maintained at this temperature for 2 hours. The furnace was rocked ±5° about the horizontal at a rate of one cycle every 2 hours during the heating process. The ampoule 1 was then cooled.

The cooled ampoule 1 was then transferred to a vertically disposed tubular furnace 6 (FIG. 5a). The ampoule 1 was suspended in the furnace 6 by means of a wire 7 secured to an eyelet 8 integrally formed with the upper end of the ampoule 1. The wire 7 passed through a bore 9 in an alumina plug 10 which fitted in the top end of the furnace tube 11 of the furnace 6. The temperature of the ampoule 1 was raised to 825° C. over a period of 24 hours, the contents 12 of the ampoule 1 being remelted. The ampoule 1 was then lowered through a temperature gradient of 20° C./mm at a rate of 50 mm/minute, the molten contents 12 of the ampoule 1 being converted into a polycrystalline cast ingot 150 mm long and 13 mm in diameter. The temperature profile of the furnace 6 is shown in FIG. 5b.

The cast ingot was then removed from the ampoule 1 by dissolving the ampoule 1 in 40% by weight semiconductor reagent quality hydrofluoric acid. The cast ingot was washed and dried, and was then inserted into a silica ampoule 13 (FIG. 6a) having an internal diameter of 13.5 mm, but which was similarly shaped at its closed end to the ampoule 1. A silica rod 19 which was 150 mm long and had a diameter of 10 mm was attached to the closed end of the ampoule 13. This silica rod 19 was coupled to drive means (not shown) whereby the ampoule 13 could be moved at a controlled rate in a vertical direction and could be rotated. The ampoule 13 had a larger inside diameter than the ampoule 1 in order to minimise the risk of the ampoule breaking during subsequent processing. Two solid silica cylinders 14 and 15, each 13 mm in diameter and 25 mm high, were inserted in the ampoule 13 above the ingot 16, the ampoule 13 was evacuated, and the ampoule 13 was sealed by collapsing the open end of the ampoule 13 onto the silica cylinder 15. The purpose of using the silica cylinders is to reduce the free space in the ampoule 13 above the ingot 16, and two silica cylinders are used since the discontinuity between the cylinders 14 and 15 provides a thermal break between the ingot 16 and the region at which the ampoule 13 is sealed to the silica cylinder 15 during the step of sealing the ampoule 13 to the silica cylinder 15.

The sealed ampoule 13 was then placed in a vertically disposed zoning furnace 17 (FIG. 6a). Initially the entire ingot 16 was disposed above a region 18 in the furnace at which the cadmium mercury telluride would be molten ($S_{0.2}$ indicated in FIG. 6b is the solidus temperature of cadmium mercury telluride containing 20% CdTe). Then the ampoule 13, which was rotated at 5 revolutions per minute, was lowered through the furnace at 0.5 mm/hour. The tip of the ingot 21 melted, and the molten portion of the ingot 16 grew upwards as the ampoule 13 was lowered, and ultimately formed a molten zone 20 to 45 mm long. The molten material began to form a single crystal at the tip of the conical portion of the ampoule 13, and the molten zone passed through the whole length of the ingot 16. The solidified single crystal passed through a temperature gradient of 20° C./mm which extended from 810° C. to 20° C. The longitudinal temperature profile of the zoning furnace 17 is shown in FIG. 6b. Approximately 15% of the single crystal thus grown was suitable for use in photoconductive infra-red detector elements suitable for operating in the wavelength range from 8 to 14 μm.

We claim:

1. A method of making a monocrystalline ternary semiconductor compound material comprising the steps of preparing a melt of said semiconductor compound, quenching said melt so as to produce a polycrystalline ingot and then melting a portion of said ingot to thereby allow a crystal nucleus to form and then propagating a single crystal growth through the remainder of said ingot, characterized in that said single crystal growth in the remainder of said ingot is propagated by passing a single molten zone through said ingot at a rate of from 0.1 to 2 mms per hour, said molten zone having a length which is from 25 to 40% of the length of said ingot.

2. A method of claim 1 wherein the ternary semiconductor compound consists of three elements, all of the elements being selected from Group IIB and Group VIB of the Mendeleev Periodic Classification with the proviso that at least one element is a Group IIB element and at least one element is a Group VIB element.

3. A method as claimed in claim 2, wherein the ternary semiconductor compound is cadmium mercury telluride.

4. A method of claim 1 wherein the ternary semiconductor compound consists of three elements selected from the Group IIIV and Group VB of the Mendeleev Periodic Classification with the proviso that at least one element is a Group IIIB element and at least one element is a Group VB element.

5. A method as claimed in claim 4, wherein the ternary semiconductor compound is indium antimonide arsenide.

6. A method of claim 1 wherein the ternary semiconductor compound consists of three elements selected from the Group IVB and Group VIB of the Mendeleev Periodic Classification with the proviso that at least one element is a Group IVB element and one element is a Group VIB element.

7. A method as claimed in claim 6, wherein the ternary semiconductor compound is lead tin telluride.

* * * * *